United States Patent
Singh

(10) Patent No.: US 11,384,722 B2
(45) Date of Patent: Jul. 12, 2022

(54) INJECTOR CLOSED LOOP CONTROL

(71) Applicant: DELPHI TECHNOLOGIES IP LIMITED, St. Michael (BB)

(72) Inventor: Divjot Singh, High Wycombe (GB)

(73) Assignee: DELPHI TECHNOLOGIES IP LIMITED, St. Michael (BB)

(*) Notice: Subject to any disclaimer, the term of this patent is extended or adjusted under 35 U.S.C. 154(b) by 109 days.

(21) Appl. No.: 16/627,417

(22) PCT Filed: Jun. 28, 2018

(86) PCT No.: PCT/EP2018/067364
§ 371 (c)(1),
(2) Date: Dec. 30, 2019

(87) PCT Pub. No.: WO2019/002440
PCT Pub. Date: Jan. 3, 2019

(65) Prior Publication Data
US 2020/0124007 A1    Apr. 23, 2020

(30) Foreign Application Priority Data

Jun. 30, 2017 (GB) .................................. 1710526

(51) Int. Cl.
| | | |
|---|---|---|
| F02M 1/00 | (2006.01) |
| F02M 51/00 | (2006.01) |
| F02D 35/02 | (2006.01) |
| F02D 41/30 | (2006.01) |
| F02M 51/06 | (2006.01) |
| F02M 57/00 | (2006.01) |
| F02M 61/16 | (2006.01) |

(Continued)

(52) U.S. Cl.
CPC ......... *F02M 51/005* (2013.01); *F02D 35/027* (2013.01); *F02D 41/3005* (2013.01); *F02M 51/0607* (2013.01); *F02M 57/005* (2013.01); *F02M 61/168* (2013.01); *G01L 23/222* (2013.01); *H01L 41/1132* (2013.01); *H01R 13/6683* (2013.01); *F02M 2200/241* (2013.01); *F02M 2200/9015* (2013.01)

(58) Field of Classification Search
CPC .............. F02D 35/027; F02D 41/3005; F02M 2200/24; F02M 2200/241; F02M 2200/9015; F02M 51/005
See application file for complete search history.

(56) References Cited

U.S. PATENT DOCUMENTS 4,945,755 A    8/1990    Komurasaki
4,966,031 A *  10/1990   Mochizuki ............. G01H 11/08
                                                  310/329

(Continued)

FOREIGN PATENT DOCUMENTS

CN        102900578 A      1/2013
DE    102007045642 A1      4/2009
(Continued)

*Primary Examiner* — John Kwon
(74) *Attorney, Agent, or Firm* — Joshua M. Haines

(57) ABSTRACT

An electrical connector includes two lateral mounting bush. A knock sensor which delivers data representative of the operation of a fuel injector is integrally overmoulded in one of the mounting bush. The knock sensor includes a piezoelectric member arranged between a base member and a seismic member.

17 Claims, 5 Drawing Sheets

(51) Int. Cl.
*G01L 23/22* (2006.01)
*H01L 41/113* (2006.01)
*H01R 13/66* (2006.01)

(56) References Cited

U.S. PATENT DOCUMENTS

| | | | | |
|---|---|---|---|---|
| 5,398,540 | A * | 3/1995 | Entenmann | G01L 23/222 73/35.11 |
| 5,744,698 | A * | 4/1998 | Genot | G01L 23/222 73/35.11 |
| 5,895,840 | A | 4/1999 | Ohuchi et al. | |
| 6,647,760 | B2 | 11/2003 | Mueller et al. | |
| 2001/0020384 | A1 * | 9/2001 | Mueller | G01L 23/222 73/35.11 |
| 2003/0056594 | A1 * | 3/2003 | Mueller | G01H 11/08 73/649 |
| 2003/0110863 | A1 * | 6/2003 | Mueller | G01L 23/222 73/649 |
| 2003/0183216 | A1 | 10/2003 | Gottemoller et al. | |
| 2009/0118983 | A1 | 5/2009 | Kondo et al. | |
| 2010/0096480 | A1 | 4/2010 | Kondo et al. | |
| 2010/0252002 | A1 | 10/2010 | Fujino et al. | |
| 2012/0031376 | A1 | 2/2012 | Magel | |
| 2012/0149242 | A1 | 6/2012 | Kagami et al. | |
| 2013/0104627 | A1 * | 5/2013 | Hagio | G01L 23/222 73/35.11 |
| 2017/0242049 | A1 * | 8/2017 | Vermelle | G01L 23/222 |
| 2018/0142655 | A1 * | 5/2018 | Thomas | F02M 51/005 |
| 2020/0395527 | A1 * | 12/2020 | Van Est | G01P 15/09 |

FOREIGN PATENT DOCUMENTS

| | | |
|---|---|---|
| DE | 102010016424 A1 | 11/2010 |
| WO | 2009040251 A1 | 4/2009 |
| WO | 2012110160 A1 | 8/2012 |

* cited by examiner

INJECTOR CLOSED LOOP CONTROL

CROSS REFERENCE TO RELATED APPLICATIONS

This application is a national stage application under 35 USC 371 of PCT Application No. PCT/EP2018/067364 having an international filing date of Jun. 28, 2018, which is designated in the United States and which claimed the benefit of GB Patent Application No. 1710526.3 filed on Jun. 30, 2017, the entire disclosures of each are hereby incorporated by reference in their entirety.

TECHNICAL FIELD

The present invention relates to a fuel injector with closed loop control and more precisely to an electric connector integrating a knock sensor.

BACKGROUND OF THE INVENTION

Close loop control is a major improvement in fuel injection equipment wherein an electronic command unit constantly adjusts the command signals it sends to the injectors as a function of sensor signals received from said injectors and representative of the actual operation of the injector. Several embodiments for arranging sensors on a injector have been proposed and EP1961952 proposes, with no specific details, the concept of a sensor module grouping several sensors on the top end of a fuel injector body.

More precisely, measuring the pressure fluctuations on the inlet HP conduit of a fuel injector is a recurrent proposal. In DE102010016424 is proposed to arrange a pressure sensor close to the fuel inlet on a lateral face of the injector body, said sensor being separated from the HP conduit by a thin wall and, it is thus adapted to measure pressure fluctuations in said HP inlet conduit. US2010096480, EP2058510, US2012149242 and US2010252002 also propose to measure the pressure in the HP conduit by arranging a pressure sensor on a plug closing an end of a HP branch extending from the main HP conduit toward the top of the injector body, thus also adapted to measure pressure fluctuations in the HP conduit. The electronic control unit receiving the signal representative of the pressure fluctuations in the HP conduit can determine beginning and duration of an injection event and can adjust the command signal it sends.

Another conceptual proposed made in DE102007045642, without detailing the embodiment, is to integrate an acceleration sensor in the head portion of the housing of the injector in order to detect the stops of the valve element when closing or opening. Indeed, when reaching the closed position, the needle valve member gets in complementary sealing contact with a seat face arranged in the injector body and said contact knock generates a sound wave that propagates in the injector body and that is sensed by said acceleration sensor. More precisely, WO2016180562A1 proposes to arrange a knock sensor in a fixation bush of the electrical connector of the injector. The knock sensor comprises a piezoelectric washer sandwiched and compressed between a base washer and spring washers, all said washers being stacked on a tubular holding member whereon the piezo washer is compressed and retained with a clip member arranged at an end of said holding tube. After assembly the sensor is arranged in a mounting bush of the electrical connector and, for fixing the connector onto the injector, a fixation screw is engaged in a hole of the mounting bush extending through the sensor's holding tube and said screw is tightened in a complementary threaded hole of the injector body. Such sensor arrangement requires numerous and complex manufacturing operation to make the individual washers and holding tube then to assemble and compress said elements.

A more integrated, more simple, less costly and better integrated embodiment is necessary to fulfill the most recent needs in fuel injection performance.

SUMMARY OF THE INVENTION

Accordingly, it is an object of the present invention to resolve the above mentioned problems in providing an electrical connector having a plastic moulded body defining a central main member for engaging a complementary connector and, two lateral mounting bush each being provided with a hole for engaging a fixation screw tightened in a face of a fuel injector and wherein, a knock sensor adapted to deliver data representative of the operation of said fuel injector is integrally overmoulded in one of the mounting bush.

Advantageously, said knock sensor comprises a piezoelectric member arranged between a base member and a seismic member.

Also, said piezoelectric, base and seismic members have a washer-like shape defining a hole extending throughout the sensor and arranged aligned with the bush hole so that, in use, the fixation screw extends through the sensor.

Also, when tightened, the fixation screw generates a compression force in the piezoelectric member.

Also, the base member is arranged against the face of the fuel injector and, the seismic member is arranged to be under the head of the fixation screw.

Also, wherein said electrical connector includes processing circuitry connected to said sensor and adapted to process data from said sensor.

The electrical connector further includes memory storage means for storing data characteristic of the fuel injector, raw or processed sensor data.

The electrical connector also includes connection means to supply processed or raw sensor data to an engine control or diagnostic unit.

The invention extends to a fuel injector having an elongated body extending along a main axis from a top end to an injection tip end, said injector body housing a needle valve member axially moving, in use, under the influence of pressure differences generated by the displacement of an electrovalve opening or closing a spill orifice, the needle moving between a closed position wherein a closing face of the needle abuts a seat of the injector body and, a fully open position wherein said closing face is lifted away from said seat.

The fuel injector further comprises an electrical connector as previously described, said connector being fixedly tightened on a face of said elongated body, and having terminals electrically connected to the electrovalve, the knock sensor integrated in a mounting bush of the electrical connector being connected to an electronic unit, the sensor delivering, in use, a signal representative of a knock generated by the abutment of the closing face against the seat when the needle gets in closed position. Also, when getting in said fully open position, the needle hits a face of the injector body generating another knock detected by the knock sensor.

Said connector is arranged so that the fixation screws extend in parallel to the main axis.

Precisely, said connector is arranged on a top end face of the injector body, the central main member of the connector being aligned to the main axis.

Said injector is a diesel injector.

The invention extends to a fuel injection equipment arranged on an internal combustion engine, said equipment comprising fuel injectors and an electronic unit arranged to receive sensor signals delivered by the knock sensor and to deliver command signals to the electrovalve.

The invention extends to a closed loop method for controlling a fuel injection equipment, the method comprising the step of computing the command signal sent to the electrovalve as a function of the sensor signals received from the knock sensor.

The invention extends to an electronic unit adapted to execute such a method.

BRIEF DESCRIPTION OF THE DRAWINGS

The present invention is now described by way of example with reference to the accompanying drawings in which.

DESCRIPTION OF THE PREFERRED EMBODIMENTS

Figure 1:
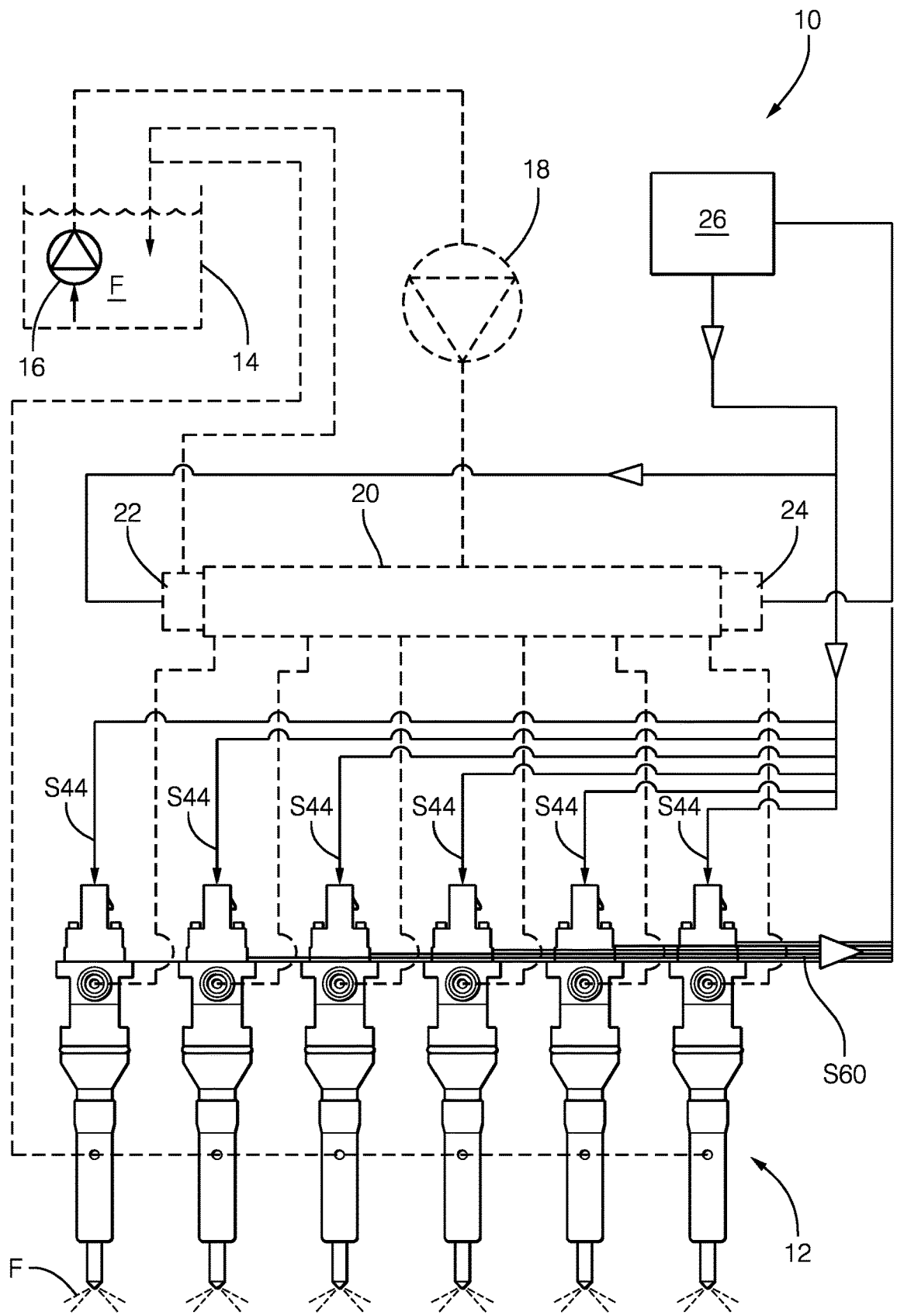
FIG. 1 is a schematic of a fuel injection equipment with closed loop control.

The schematic of a diesel fuel injection equipment 10 of an internal combustion engine is shown on FIG. 1, the hydraulic circuits being represented in dotted lines and the control being in solid lines.

The equipment 10 has six fuel injectors 12 and, in following the hydraulic stream flow direction, fuel F is drawn from a tank 14 by a feed pump 16 and delivered to a high pressure pump 18, wherein said fuel is pressurised and sent to a common rail 20. The pressure in the rail 20 is controlled by a valve 22 associated to a pressure sensor 24 and, depending on the pressure measured, the valve 22 closes or opens a return line wherein fuel in excess returns to the tank 14 lowering the rail internal pressure. The fuel F remaining in the rail 20 is delivered to the six injectors 12, part of which being sprayed to fulfill the engine torque and power requirements, the other part serving to operate the injectors and being afterward returned to the tank 14 via another return line.

Many other hydraulic architecture are known with more or less injectors depending on the engine, or without rail, the injectors being directly fed by the pump in rail-less equipment's.

The equipment 10 is controlled by an electronic control unit 26, here after ECU, which executes a closed loop method 100.

In addition to the engine operational data and requirements, the ECU 26 receives signals from the injectors 12 and from the pressure sensor 24 and, said signals received are integrated in the computation of command signals sent to the valve 22 and to the injectors 12.

For instance, should the rail inner pressure measured by the sensor 24 and sent to the ECU 26 be lower than what is required by the engine, the ECU sends to the valve 22 a command signal to close the return line so the inner pressure can rise to the required level. To the contrary, should the rail inner pressure measured by the sensor 24 be too high, the ECU sends to the valve a command signal to open said return line so fuel in excess returns to the tank and the rail inner pressure drops.

Figure 2:
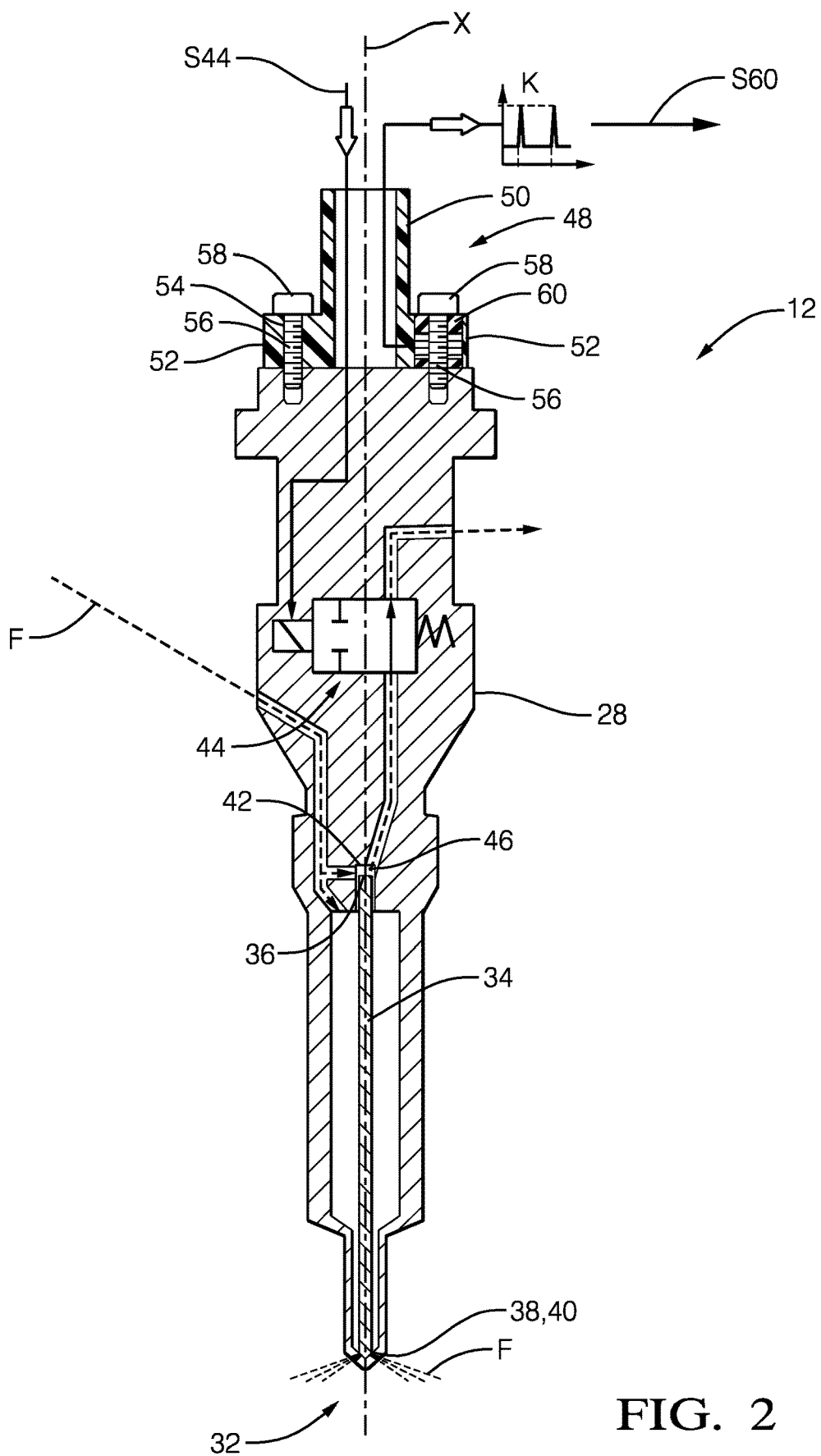
FIG. 2 is a schematic of fuel injector of the equipment of FIG. 1, atop said injector being fixed an electrical connector integrating a knock sensor as per the invention.
Figure 3:
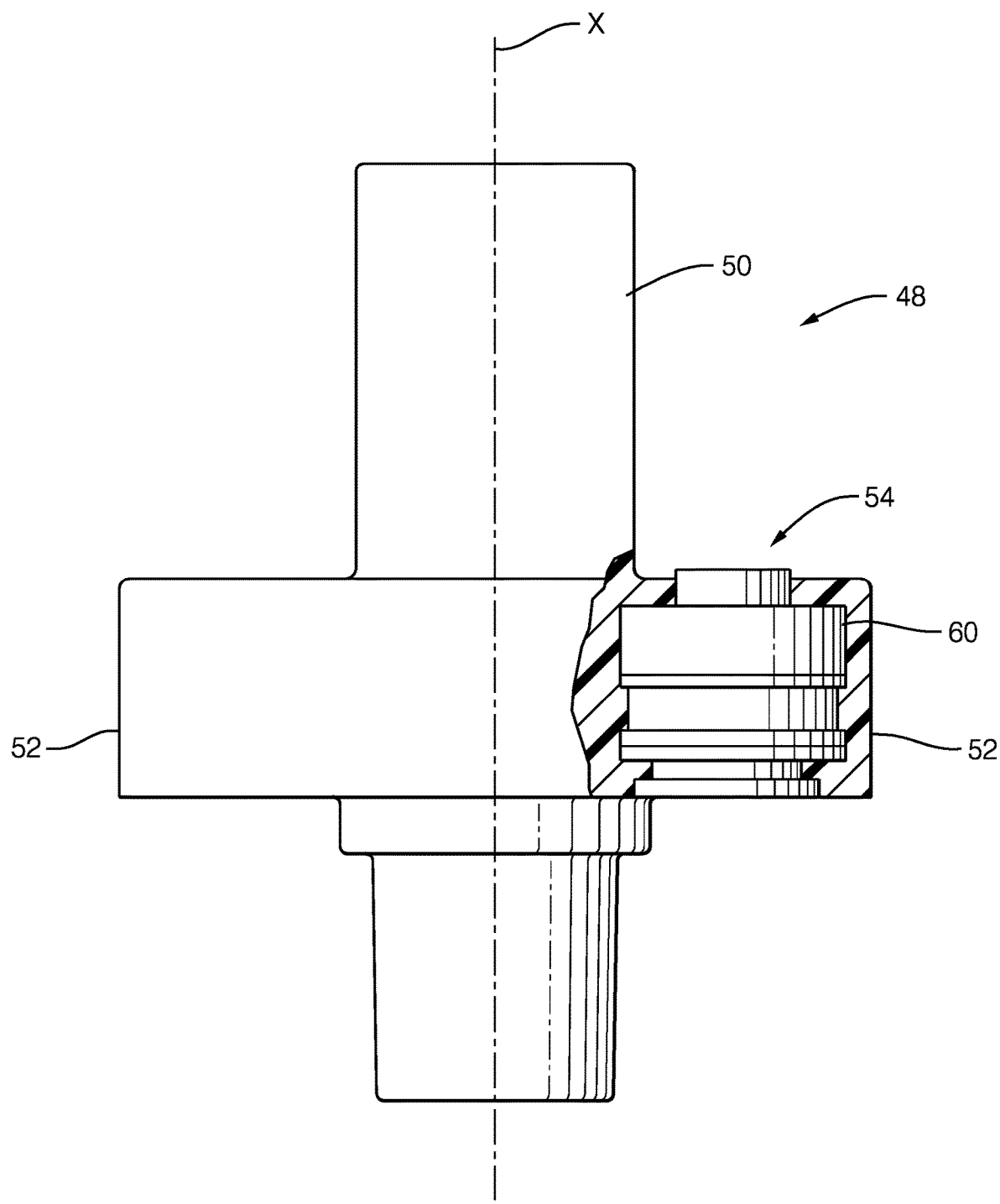
FIG. 3 is an axial section of the electrical connector detailing the sensor integration into the electrical connector.
Figure 4:
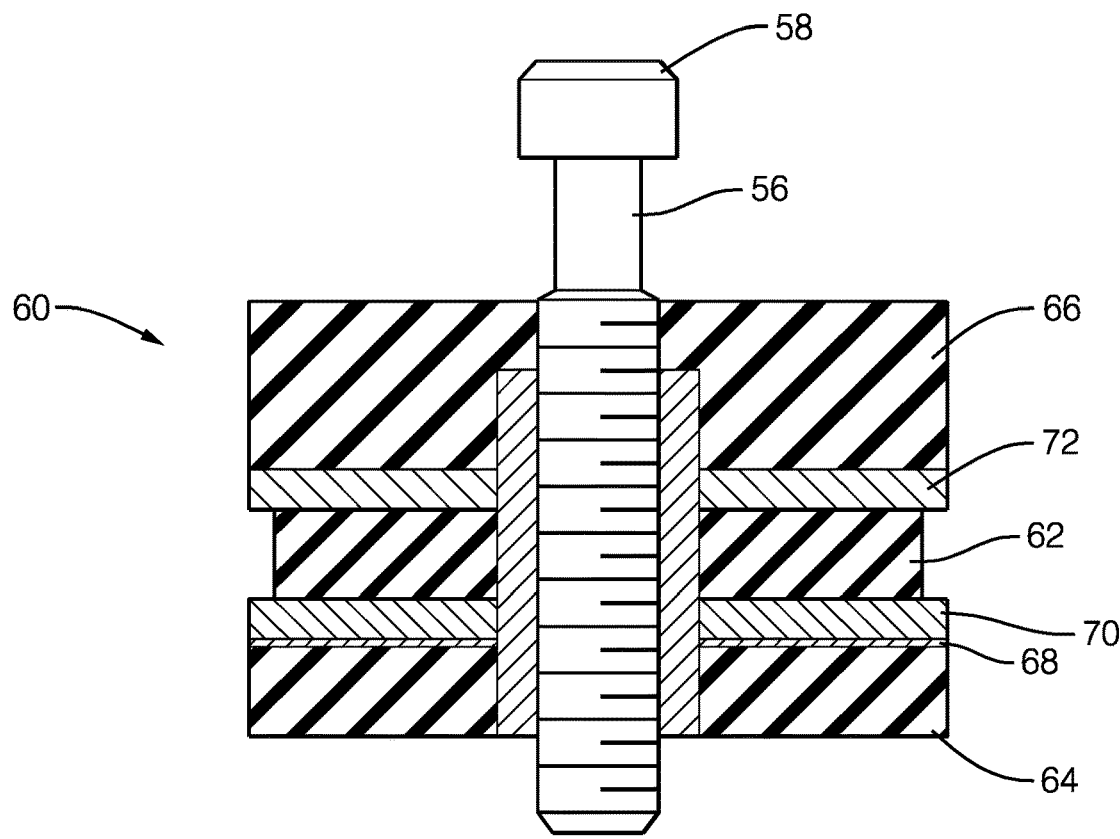
FIG. 4 is a sketch presenting a general concept of the knock sensor.

A diesel fuel injector 12 is presented on FIG. 2 and it comprises an elongated body 28 extending along a main axis X and adapted to be inserted in a well provided in the engine block. Said body 28 extends between a top end 30 that remains, in use, outside the well, to a tip end 32 that is inside the well and wherefrom fuel is sprayed. In said body 28 is arranged a needle valve member 34 axially X guided in a bore between a closed position CP, where fuel injection is prevented and, a fully open position OP where injection is enabled. Said needle 34 extends between a head where a stop face 36 is defined and, a tip end defining a closing face 38.

In closed position CP, the closing face 38 of the needle is urged in sealing contact against a seat 40 defined in the body thus preventing fuel injection through spray holes opening downstream said seat. When opening, the closing face 38 lifts away from the seat 40 enabling fuel injection and, when getting to the fully open position OP the stop face 36 abuts a complementary stop face 42 of the body that stops the move of the needle.

To move the needle from a position to the other an electrovalve 44 opens or closes a spill orifice enabling or preventing fuel captured in a control chamber 46 wherein the needle head extends to exit and return toward the tank. When said electrovalve 44 closes said spill orifice the pressure rises in the control chamber 46 urging the needle toward the closed position CP and, when the electrovalve 44 opens the spill orifice, the pressure drops in the control chamber 46 and the needle lifts toward the open position OP.

At both extremities of the displacement, a face of the needle hits a face of the body. In closed position CP, the closing face 38 knocks on the seat 40 and, in fully open position OP the stop face 36 of the needle knocks against the complementary stop face 42 of the body. In both cases said knock K generates a sound wave that propagates in the body along the axial direction X.

The fuel injector further comprises an electric connector 48 arranged on the top end 30 of its body, said connector 48 having at least two terminals 49, a plastic moulded body integrally defining a main central member 50 and two lateral mounting bush 52 for fixing the connector on the injector body. The central member 50 comprises electrical terminals for internally connecting electrical leads extending in the injector body from the electrovalve 44 and externally, for complementary connection with an a connector from the ECU 26.

Each of the mounting bush 52 defines an axially X extending lateral protrusion to the main central member 50 and having a through hole 54 wherein extends a fixation screw 56 bolted in a threaded hole provided in the injector body 28. As the screw is tightened, the bush 52 is axially X compressed between the injector body and the screw head 58.

Also, a knock sensor 60 is integrally overmoulded in one of the mounting bush 52, said sensor 60 being compressed between the injector body and the screw head 58 and it generates a signal S60 relevant of the knock K of the needle reaching the closed position CP or the open position OP. Said knock K sound wave travels extremely quickly in the body and the signal S60 is generated quasi simultaneously to the needle hitting the body in one of said extreme positions.

Figure 6:
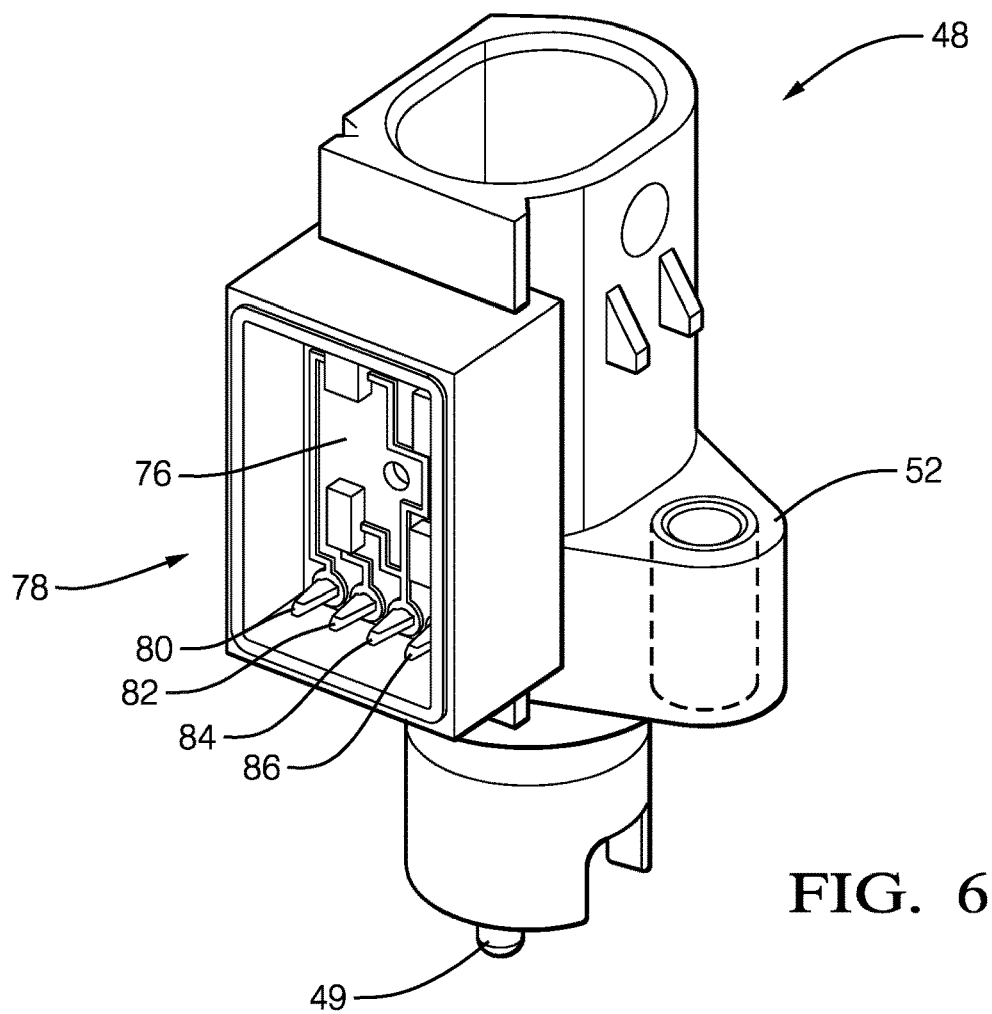
FIG. 6 is a 3D view of the electrical connector.

An electronic circuit board 76, shown on FIG. 6, may be housed in a compartment 78 of the electrical connector, said board 76 receiving and processing the raw signals from the knock sensor 60 an then forwarding a signal pre-processed ready for being treated by the ECU.

As part to the close loop control method 100, the moves of the needle are indirectly commanded since following a first command signal S44 sent by the ECU 26 to the electrovalve 44 then a subsequent second hydraulic amplification rising, or dropping, the pressure in the control chamber 46. The control of the needle motion loops with the sensor signal S60 that is received by the ECU 26 informing about the actual opening or closing of the needle and, therefore, the ECU computes, step 110 of the method 100, the electrovalve command signal S44 in consideration of said sensor signal S60.

The knock sensor 60 comprises an active piezoelectric member 62 sandwiched between a steel made base member 64 and a steel made seismic member 66. The base member 64 is against the injector body while the seismic member 66, on the opposite side of the piezo-member, is just under the screw head 58. Said three members are washers centrally holed so the fixation screw 56 extends in the middle of said sensor.

Between the piezo-member 62 and the base member 64 are inserted an electrically isolation washer 68, arranged against the base 64 and, an electrical contact washer 70 against the piezo 62 and adapted for connection to the ECU or to said pre-processing circuit board. On the other side the ground contact washer 72 is arranged between the piezo washer 62 and the seismic member 66. Also, a tubular radial insulator member 74 is arranged in the through hole axially extending throughout the sensor 60, said insulator 74 enabling passage of the fixation screw 56 and preventing physical contacts with the piezo member 62.

Figure 5:
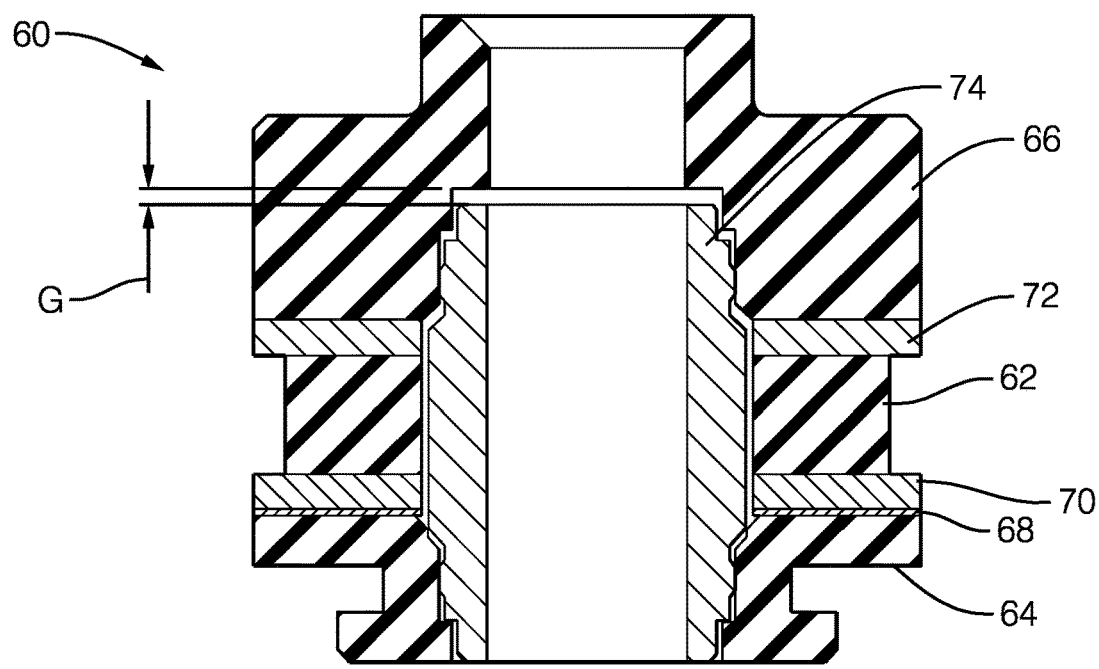
FIG. 5 is an axial section of a specific embodiment of said sensor.

An actual embodiment of the knock sensor 60 is presented in FIG. 5 where the assembling method follows the following sequence:
a) engaging the holding tubular member 74 in the central hole of the base washer 64,
b) engaging around the holding member 74 the isolation washer 68, the electrical contact washer 70, the piezoelectric washer 62, the ground washer 72 and finally the seismic member 66.

As visible on the figure, the seismic member 66 comprises a main outer annular portion, that is in surface contact against the ground washer 72 and, a central portion extending above the holding member without being in contact with it and defining therebetween a gap G so that, the force of the fixation screw is transmitted from the seismic mass 66 to the piezo washer and not to the holding member.

After being stacked as shown, the sensor 60 is overmoulded in a mounting bush of the plastic connector.

To be operational and deliver a significant knock signal, the piezo washer must be pre-compressed which is not the case after assembling the washer elements or after overmoulding. Said necessary compression is only generated by the fixation screw 56 that is tightened in the injector body axially compressing the mounting bush, and the sensor 60, between said injector body and the screw head 58.

Figure 7:
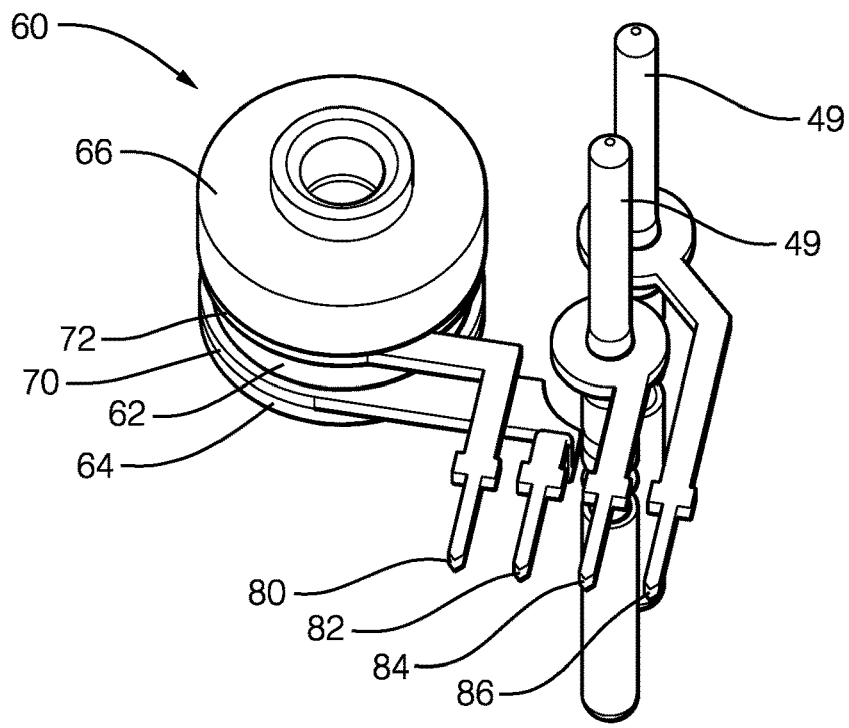
FIG. 7 discloses the connection routing embedded in said electrical connector.

As shown on FIG. 7, four terminals 80, 82, 84, 86 (from the left to the right of the figure) are arranged and overmoulded in said electrical connector 48 to enable the raw signal generated by the piezoelectric member 62 of the sensor to be sent to said circuit board 76 and, there to be pre-processed prior to be sent to the ECU 26.

Each of said terminals 80-86 extend between an end having an annular washer shape and an opposite end forming a pin, all four pins being aligned and parallel to one another forming a 4-pin plug connecting said circuit board 76.

The terminal 80, represented on the left of FIG. 7 is a ground terminal, its annular washer end is the ground washer 72 part of the sensor.

Next to said ground terminal is the raw signal terminal 82, which annular washer end is the electrical contact washer 70 part of the sensor and receiving said raw signal.

The third 84 and fourth 86 terminals link the circuit board 76 to the main terminals 49 of the connector 48 thus enabling the pre-processed signal to be sent to the ECU 26.

Thanks to this arrangement, manufacturing is eased since the sensor 60 integrates all the means necessary to generate and deliver the raw signal: the piezoelectric member, the seismic washer, the base member, the ground terminal 72, 80 and the contact terminal 70, 82. No connection is needed from the other mounting bush.

Thanks to said arrangement, the sensor 60 is simplified over the prior art, it requires less pieces and less manufacturing operations, assembly is much easier without requiring any pre-compression steps.

In operation, the connector 48 being fixed to the injector and, the sensor 60 being pre-compressed by the fixation screw 56, when a knock K occurs, the related sound wave travels through the sensor's washers and is sensed by the sensor 60. At the end, the seismic member 66 does not move and the piezo member 62 gets further compressed generating a relevant a clear signal S60. The seismic member 66 does not move because it has a mass generating a kinetic inertia important enough not to be displaced by the energy of the sound wave.

Conclusive results have been obtained with a sensor 60 overmoulded in a mounting bush 52, the sensor 60 having an outer diameter D54 of 12 mm and a height H54 of 11 mm; the seismic member 66 being made of stainless steel and having a mass of 3 g, the fixation screw 56 is a standard M4 and is tightened with a 2 Nm torque generating a compression force of about 2 kN in the piezo member 62.

LIST OF REFERENCES

F fuel
X main axis
OP open position
CP closed position
S44 command signal sent to the electrovalve
S60 signal generated by the sensor
K knock
G gap
10 fuel injection equipment
12 injector
14 tank
16 feed pump
18 high pressure pump
20 common rail
22 valve
24 pressure sensor
26 electronic control unit—ECU 28 injector body
30 top end of the body
32 tip end of the body
34 needle valve member
36 stop face of the needle
38 closing face of the needle
40 seat of the body
42 complementary stop face of the body
44 electrovalve
46 control chamber
48 electrical connector
49 main terminals
50 central member
52 mounting bush
54 central hole
56 fixation screw
58 screw head
60 knock sensor
62 piezoelectric member
64 base member
66 seismic member
68 isolation washer
70 electrical contact washer
72 ground contact washer
74 tubular insulator member
76 electronic circuit board
78 compartment
80, 82, 84, 86 terminals
100 method
110 computing step

The invention claimed is:

1. An electrical connector comprising:
a plastic moulded body defining a central main member for engaging a complementary connector, and also defining two lateral mounting bush which are each provided with a hole for engaging a fixation screw tightened in a face of a fuel injector; and
a knock sensor adapted to deliver data representative of operation of said fuel injector and integrally overmoulded in one of the lateral mounting bush, said knock sensor comprising a piezoelectric member arranged between a base member and a seismic member.

2. An electrical connector as claimed in claim 1, wherein said piezoelectric member, said base member, and said seismic member have a washer-like shape defining a hole extending throughout the knock sensor and arranged aligned with the bush hole so that the fixation screw extends through the knock sensor.

3. An electrical connector as claimed in claim 2, wherein the fixation screw generates a compression force in the piezoelectric member.

4. An electrical connector as claimed in claim 1, wherein the base member is arranged against the face of the fuel injector and, the seismic member is arranged to be under the head of the fixation screw.

5. An electrical connector as claimed in claim 1, wherein said electrical connector includes processing circuitry connected to said knock sensor and adapted to process data from said sensor.

6. An electrical connector as claimed in claim 1, further comprising memory storage means for storing data characteristic of the fuel injector and raw or processed sensor data.

7. An electrical connector as claimed in claim 1, further comprising connection means to supply processed or raw sensor data to an engine control or diagnostic unit.

8. A fuel injector comprising:
an elongated body extending along a main axis from a top end to an injection tip end, said elongated body housing a needle valve member axially moving, in use, under the influence of pressure differences generated by the displacement of an electrovalve opening or closing a spill orifice, the needle valve member moving between a closed position wherein a closing face of the needle valve member abuts a seat of the elongated body and a fully open position wherein said closing face is lifted away from said seat; and
an electrical connector comprising:
a plastic moulded body defining a central main member for engaging a complementary connector, and also defining two lateral mounting bush which are each provided with a hole for engaging a fixation screw tightened in a face of said fuel injector;
a knock sensor adapted to deliver data representative of operation of said fuel injector and integrally overmoulded in one of the lateral mounting bush, said knock sensor comprising a piezoelectric member arranged between a base member and a seismic member; and
terminals electrically connected to the electrovalve;
wherein the electrical connector is connected to an electronic unit and the knock sensor is configured to deliver a signal representative of a knock generated by abutment of the closing face against the seat when the needle valve member reaches the closed position.

9. A fuel injector as claimed in claim 8, wherein the knock sensor is configured to detect another knock generated when the valve needle member hits a face of the elongated body when the needle valve member reaches the fully open position.

10. A fuel injector as claimed in claim 8, wherein said electrical connector is arranged so that the fixation screws extend in parallel to the main axis.

11. A fuel injector as claimed claim 8, wherein said electrical connector is arranged on a top end face of the elongated body, the central main member of the electrical connector being aligned to the main axis.

12. A fuel injector as claimed in claim 8, wherein said fuel injector is a diesel injector.

13. A method for controlling a fuel injector as set forth in claim 8, said method comprising:
computing a command signal sent to the electrovalve as a function of the signal received from the knock sensor.

14. A fuel injector as claimed in claim 8, wherein said piezoelectric member, said base member, and said seismic member have a washer-like shape defining a hole extending throughout the knock sensor and arranged aligned with the bush hole so that one of the fixation screws extends through the knock sensor.

15. A fuel injector as claimed in claim 14, wherein the fixation screw which extends through the knock sensor generates a compression force in the piezoelectric member.

16. An electrical connector as claimed in claim 1, wherein the fixation screw generates a compression force in the piezoelectric member.

17. A fuel injector as claimed in claim 8, wherein the fixation screw generates a compression force in the piezoelectric member.

* * * * *